(12) United States Patent
Kasher

(10) Patent No.: US 8,290,073 B2
(45) Date of Patent: Oct. 16, 2012

(54) DEVICE, SYSTEM AND METHOD OF COMMUNICATING DATA OVER WIRELESS COMMUNICATION SYMBOLS WITH CHECK CODE

(75) Inventor: Assaf Kasher, Haifa (IL)

(73) Assignee: Intel Corporation, Santa Clara, CA (US)

( * ) Notice: Subject to any disclaimer, the term of this patent is extended or adjusted under 35 U.S.C. 154(b) by 460 days.

(21) Appl. No.: 12/575,518

(22) Filed: Oct. 8, 2009

(65) Prior Publication Data

US 2011/0085609 A1 Apr. 14, 2011

(51) Int. Cl.
H04B 7/00 (2006.01)

(52) U.S. Cl. ........ 375/260; 375/295; 370/310; 714/752; 714/758; 714/746; 714/751; 714/800

(58) Field of Classification Search .................. 375/260, 375/295; 370/310; 714/752, 758, 746, 751, 714/800
See application file for complete search history.

(56) References Cited

U.S. PATENT DOCUMENTS

| | | | | |
|---|---|---|---|---|
| 5,852,630 | A * | 12/1998 | Langberg et al. ............. | 375/219 |
| 2007/0094580 | A1* | 4/2007 | Livshitz ...................... | 714/779 |
| 2007/0143656 | A1* | 6/2007 | Niu et al. ..................... | 714/752 |
| 2007/0180349 | A1* | 8/2007 | Jacobsen ...................... | 714/776 |
| 2008/0028281 | A1* | 1/2008 | Miyazaki et al. ............. | 714/776 |
| 2008/0144729 | A1* | 6/2008 | Miyoshi et al. .............. | 375/260 |
| 2008/0204286 | A1* | 8/2008 | Kose .............................. | 341/67 |
| 2008/0279303 | A1* | 11/2008 | Wengerter et al. ............ | 375/295 |
| 2008/0320353 | A1 | 12/2008 | Blankenship et al. | |
| 2009/0307562 | A1* | 12/2009 | Lee et al. ....................... | 714/758 |
| 2010/0111145 | A1* | 5/2010 | Trachewsky et al. ......... | 375/220 |
| 2010/0199143 | A1* | 8/2010 | Sanderovich ................. | 714/752 |

FOREIGN PATENT DOCUMENTS

| | | |
|---|---|---|
| EP | 1928116 A2 | 6/2008 |
| KR | 1020070080769 A | 8/2007 |

OTHER PUBLICATIONS

Search Report and Written Opinion for PCT/US2010/046676 mailed on Apr. 29, 2011. IEEE P802.11n/D2.00, Feb. 2007, IEEE P802.11n™/D2.00, Draft Standard for Information Technology—Telecommunications and information exchange between systems—Local and metropolitan area networks—Specific requirements-Part 11: Wireless LAN Medium Access Control (MAC) and Physical Layer (PHY) specifications, pp. 1-498.

International Preliminary Report on Patentability for International Application No. PCT/US2010/046676; Mailed Apr. 19, 2012; 7 pages.

* cited by examiner

Primary Examiner — Siu Lee
(74) Attorney, Agent, or Firm — Shichrur & Co.

(57) ABSTRACT

Some demonstrative embodiments include devices, systems and/or methods of communicating data over wireless communication symbols with check-code. For example, a wireless communication unit may transmit a sequence of wireless communication symbols representing transmitted data bits, wherein a symbol of the symbols includes at least one data block, which includes a set of data bits and a set of repetition bits, the set of data bits including a first number of the transmitted data bits, and the set of repetition bits including a second number of bits, which are identical to at least a subset of the set of data bits, wherein the symbol includes at least one plurality of check-code bits corresponding to the at least one data block, respectively, and wherein the first and second numbers are based on a number of the transmitted data bits, a symbol bit-size of the symbol, at least one value related to at least one of a data-block bit-size of the data block and a number of the plurality of check-code bits. Other embodiments are described and claimed.

26 Claims, 4 Drawing Sheets

DEVICE, SYSTEM AND METHOD OF COMMUNICATING DATA OVER WIRELESS COMMUNICATION SYMBOLS WITH CHECK CODE

BACKGROUND

In the field of wireless communication, check codes may be implemented to detect and/or correct errors in data transmitted from a transmitter to a receiver over a wireless communication channel.

One example of an error correction code is the low-density parity-check (LDPC) code. The transmitted data bits may be distributed between a plurality of LDPC codewords. A LDPC codeword may have a predefined bit-size ("the LDPC codeword length"). The LDPC codeword may include a data block ("data word") including the transmitted data and a corresponding LDPC code. The LDPC code is a linear error correcting code, which may be constructed using a sparse bipartite graph. The LDPC code may include a predefined number of LDPC bits (also referred to as "LDPC parity bits" or "parity bits"), which may be determined based on the corresponding data block. A plurality of shortening bits, e.g., zero bits, may be inserted in one or more of the data blocks, e.g., in order to fit the transmitted data bits into an integer number of LDPC codewords.

A wireless transmission may include a plurality of wireless communication symbols, for example, a plurality of orthogonal-frequency-division-multiplexing (OFDM) symbols. Having a predefined OFDM symbol bit-size. A plurality of padding bits, e.g., zero bits, may be included in the wireless transmission in order to fit the transmitted data into an integer number of OFDM symbols.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
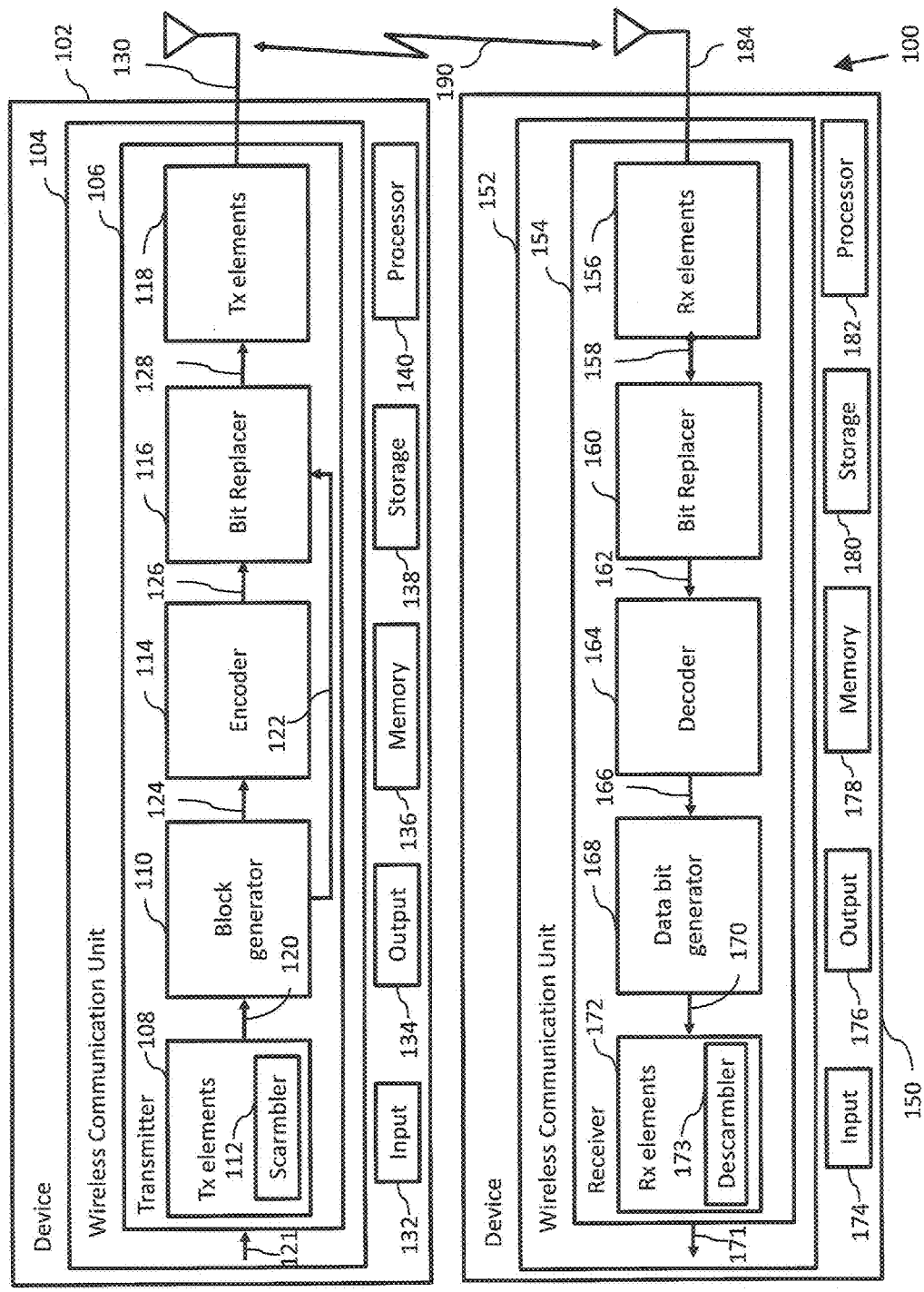
FIG. 1 is a schematic block diagram illustration of a system in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality" as used herein include, for example, "multiple" or "two or more". For example, "a plurality of items" includes two or more items.

Some embodiments may be used in conjunction with various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a wired or wireless network, a wireless area network, a Wireless Video Area Network (WVAN), a Local Area Network (LAN), a Wireless LAN (WLAN), a Personal Area Network (PAN), a Wireless PAN (WPAN), devices and/or networks operating in accordance with existing IEEE 802.11 (IEEE 802.11-1999: *Wireless LAN Medium Access Control (MAC) and Physical Layer (PHY) Specifications*), 802.11a, 802.11b, 802.11g, 802.11h, 802.11j, 802.11n, 802.11 task group ad (TGad), 802.16, 802.16d, 802.16e, 802.16f, standards and/or future versions and/or derivatives thereof, devices and/or networks operating in accordance with existing Wireless-Gigabit-Alliance (WGA) and/or WirelessHD™ specifications and/or future versions and/or derivatives thereof, units and/or devices which are part of the above networks, one way and/or two-way radio communication systems, cellular radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device (e.g., BlackBerry, Palm Treo), a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, Enhanced Data rates for GSM Evolution (EDGE), or the like. Other embodiments may be used in various other devices, systems and/or networks.

The term "wireless device" as used herein includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

Some demonstrative embodiments may be used in conjunction with suitable limited-range or short-range wireless communication networks, for example, a wireless area network, a "piconet", a WPAN, a WVAN and the like. Other embodiments may be used in conjunction with any other suitable wireless communication network.

Some demonstrative embodiments may be used in conjunction with a wireless communication network communicating over a frequency band of 60 GHz. However, other embodiments may be implemented utilizing any other suitable wireless communication frequency bands, for example, an Extremely High Frequency (EHF) band (the millimeter wave (mmwave) frequency band), e.g., a frequency band within the frequency band of between 30 Ghz and 300 GHZ, a WLAN frequency band, a WPAN frequency band, a frequency band according to the IEEE 802.11, IEEE 802.11TGad and/or WGA specifications, and the like.

Reference is now made to FIG. 1, which schematically illustrates a block diagram of a system 100 in accordance with some demonstrative embodiments.

As shown in FIG. 1, in some demonstrative embodiments, system 100 may include a wireless communication network including one or more wireless communication devices, e.g., wireless communication devices 102 and/or 150, capable of communicating content, data, information and/or signals over one or more suitable wireless communication links 190, for example, a radio channel, an IR channel, a RF channel, a Wireless Fidelity (WiFi) channel, and the like. One or more elements of system 100 may optionally be capable of communicating over any suitable wired communication links.

In some demonstrative embodiments, wireless communication devices 102 and/or 150 may include, for example, a PC, a desktop computer, a mobile computer, a laptop computer, a notebook computer, a tablet computer, a server computer, a handheld computer, a handheld device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a STB, a BD player, a BD recorder, a DVD player, a HD DVD player, a DVD recorder, a HD DVD recorder, a PVR, a broadcast HD receiver, a video source, an audio source, a video sink, an audio sink, a stereo tuner, a broadcast radio receiver, a flat panel display, a PMP, a DVC, a digital audio player, a speaker, an audio receiver, a gaming device, an audio amplifier, a data source, a data sink, a DSC, a media player, a Smartphone, a television, a music player, or the like.

In some demonstrative embodiments, wireless communication devices 102 and/or 150 may include wireless communication units 104 and/or 152, respectively, to perform wireless communication with wireless communication devices 150 and/or 102, respectively, and/or with one or more other wireless communication devices, e.g., as described below. Wireless communication device 102 may also include, for example, one or more of a processor 140, an input unit 132, an output unit 134, a memory unit 136, and a storage unit 138; and/or wireless communication device 150 may also include, for example, one or more of a processor 182, an input unit 174, an output unit 176, a memory unit 178, and a storage unit 180. Wireless communication devices 102 and/or 150 may optionally include other suitable hardware components and/or software components. In some demonstrative embodiments, some or all of the components of one or more of wireless communication devices 102 and/or 150 may be enclosed in a common housing or packaging, and may be interconnected or operably associated using one or more wired or wireless links. In other embodiments, components of one or more of wireless communication devices 102 and/or 150 may be distributed among multiple or separate devices.

Processor 140 and/or processor 182 includes, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processors 140 and/or 182 execute instructions, for example, of an Operating System (OS) of wireless communication devices 102 and/or 150, respectively, and/or of one or more suitable applications.

Input unit 132 and/or input unit 174 includes, for example, a keyboard, a keypad, a mouse, a touch-pad, a track-ball, a stylus, a microphone, or other suitable pointing device or input device. Output unit 134 and/or output unit 176 includes, for example, a monitor, a screen, a flat panel display, a Cathode Ray Tube (CRT) display unit, a Liquid Crystal Display (LCD) display unit, a plasma display unit, one or more audio speakers or earphones, or other suitable output devices.

Memory unit 136 and/or memory unit 178 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 138 and/or storage unit 180 includes, for example, a hard disk drive, a floppy disk drive, a Compact Disk (CD) drive, a CD-ROM drive, a DVD drive, or other suitable removable or non-removable storage units.

Memory units 136 and 178 and/or storage units 138, and 180, for example, may store data processed by wireless communication devices 102 and/or 150, respectively.

In some demonstrative embodiments, wireless communication units 104 and/or 152 include, for example, one or more wireless transmitters, receivers and/or transceivers able to send and/or receive wireless communication signals, RF signals, frames, blocks, transmission streams, packets, messages, data items, and/or data. For example, wireless communication units 104 and/or 154 may include or may be implemented as part of a wireless Network Interface Card (NIC), and the like.

Wireless communication unit 104 may include, or may be associated with, at least one antenna 130; and/or wireless communication unit 152 may include, or may be associated with, at least one antenna 184. Antennas 130 and/or 184 may include, for example, an internal and/or external RF antenna, a dipole antenna, a monopole antenna, an omni-directional antenna, an end fed antenna, a circularly polarized antenna, a micro-strip antenna, a diversity antenna, or other type of antenna suitable for transmitting and/or receiving wireless communication signals, blocks, frames, transmission streams, packets, messages and/or data.

Wireless communication unit 104 may include, for example, a transmitter (Tx) 106 capable of transmitting wireless communication signals to wireless communication device 150 via antenna 130; and/or wireless communication unit 152 may include a receiver (Rx) 154 to receive the wireless communication signals via antenna 184, e.g., as described in detail below.

In some demonstrative embodiments, wireless communication unit 104 may transmit a sequence of wireless communication symbols representing a plurality of data bits 120 ("the transmitted data bits"). Data bits 120 may include any suitable plurality of data bits representing data to be transmitted by wireless communication unit 104. Data bits 120 may be received from any suitable component of device 102, e.g., from any suitable transmission element 108 of transmitter 106. In one example, data bits 120 may be received from a suitable scrambler 112. Data bits 120 may represent and/or correspond to any suitable input data 121, which may be received from any suitable component of device 102, e.g., processor 140, memory 138 and/or storage 136.

In some demonstrative embodiments, e.g., as described herein, the sequence of wireless communication symbols may include a sequence of OFDM symbols. However, in other embodiments, the sequence of wireless communication symbols any include any other suitable wireless communication symbols, blocks, units, and the like.

In some demonstrative embodiments, a symbol of the sequence of symbols may include at least one data block (also referred to as "data word"), which includes a set of data bits and a set of repetition bits. The set of data bits may include a first number, denoted $L_{CWS}$, of data bits 120, and the set of repetition bits may include a second number of bits, denoted $N_{SHORT-SYM}$, which are identical to at least a subset of the set of data bits. The symbol may also include at least one plurality of check-code bits corresponding to the at least one data block, respectively, e.g., as described in detail below.

In some demonstrative embodiments, wireless communication unit 104 may determine the numbers $L_{CWS}$ and $N_{SHORT-SYM}$ based on a number, denoted $N_{Data}$, of data bits 120, a symbol bit-size of the symbol, a data-block bit-size of the data block, and a number of the plurality of check-code bits, e.g., as described below.

The term "bit-size" as used herein with reference to an element may relate to a number of bits included in, or represented by, the element, e.g., the bit-size of a symbol may refer to a number of bits included in the symbol.

Figure 2:
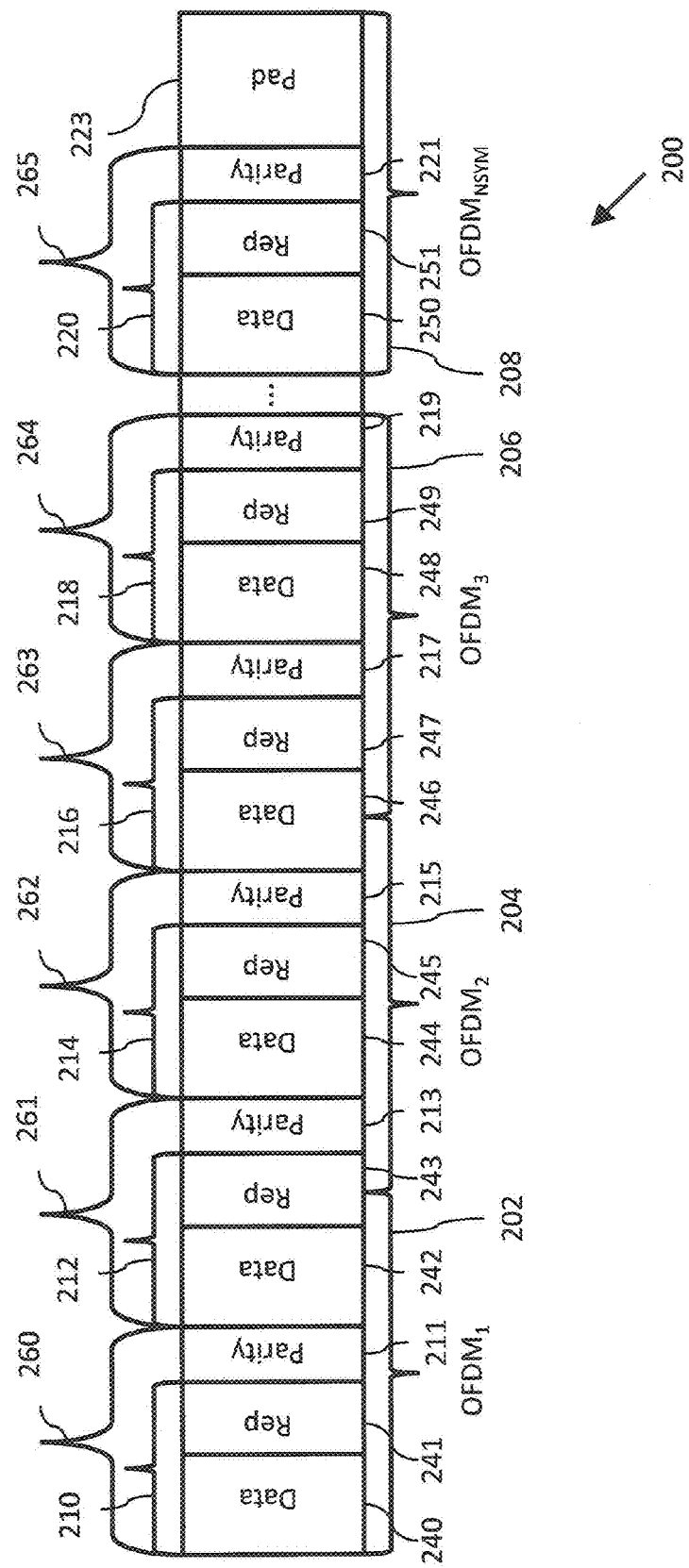
FIG. 2 is a schematic illustration of a sequence of wireless communication symbols, in accordance with some demonstrative embodiments.

Reference is also made to FIG. 2, which schematically illustrates a sequence of wireless communication symbols 200, in accordance with some demonstrative embodiments. In some demonstrative embodiments, symbols 200 may be transmitted by a transmitter, e.g., transmitter 106 (FIG. 1), based on a plurality of transmitted data bits, e.g., data bits 120 (FIG. 1).

In some demonstrative embodiments, symbols 200 may include a sequence of OFDM symbols, including $N_{SYM}$ symbols, e.g., including symbols 202, 204, 206 and 208, denoted $OFDM_1$, $OFDM_2$, $OFDM_3$ and $OFDM_{NSYM}$, respectively. In other embodiments, symbols 200 may include any other suitable wireless communication symbols.

In some demonstrative embodiments, symbols 202, 204, 206 and/or 208 may each have a predefined symbol bit-size. For example, symbols 202, 204, 206 and/or 208 may have the same predefined symbol bit-size, denoted $N_{CBPS}$.

In some demonstrative embodiments, symbols 200 may include a sequence of $N_{CW}$ codewords, e.g., including codewords 260, 261, 262, 263, 264 and 265. A codeword of codewords 260, 261, 262, 263, 264 and 265 may include a data block and a plurality of check-code bits corresponding to the data block. For example, data bits 120 (FIG. 1) may be distributed to $N_{CW}$ data blocks, e.g., including data blocks 210, 212, 214, 216, 218 and 220.

In some demonstrative embodiments, codewords 260, 261, 262, 263, 264 and 265 may include data blocks 210, 212, 214, 216, 218 and 220, respectively; and check-code bits 211, 213, 215, 217, 219 and 221, respectively. Codewords 260, 261, 262, 263, 264 and 265 may each have a predefined codeword bit-size, denoted $L_{CW}$.

In some demonstrative embodiments, a data block bit-size of data blocks 210, 212, 214, 216, 218 and 220 and/or a check-code bit-size, denoted "n-k", of the pluralities of check-code bits 211, 213, 215, 217, 219 and 221 may be related to the codeword bit-size $L_{CW}$ and a ratio ("check-code rate"), denoted R, wherein 0<R<1, between the data-block bit size and the codeword bit-size $L_{CW}$. For example, the bit-size of data blocks 210, 212, 214, 216, 218 and 220 may be determined as the product of $L_{CW}$ and R; and the check-code bit-size of the pluralities of check-code bits 211, 213, 215, 217, 219 and 221 may be determined as the product of $L_{CW}$ and (1−R).

In some demonstrative embodiments, a data block of data blocks 210, 212, 214, 216, 218 and 220 may include a set of data bits including $L_{CWS}$ bits of the transmitted data bits. In one example, data blocks 210, 212, 214, 216, 218 and 220 may include first, second, third, fourth, fifth and an $N_{CW}$-th, e.g., consecutive, sets of data bits 120 (FIG. 1). In one example, data block 210 may include a first set 240 of $L_{CWS}$ bits of data bits 120 (FIG. 1); data block 212 may include a second set 242 of $L_{CWS}$ bits of data bits 120 (FIG. 1), e.g., subsequent to the first set; data block 214 may include a third set 244 of $L_{CWS}$ bits of data bits 120 (FIG. 1), e.g., subsequent to the second set; data block 216 may include a fourth set 246 of $L_{CWS}$ bits of data bits 120 (FIG. 1), e.g., subsequent to the third set; data block 218 may include a fifth set 248 of $L_{CWS}$ bits of data bits 120 (FIG. 1), e.g., subsequent to the fourth set; and data block 220 may include a remaining set 250 of bits of data bits 120 (FIG. 1), e.g., after distributing data bits 120 (FIG. 1) to $N_{CW}$−1 sets. Block 220 may include a number of bits, which is equal to the number $L_{CWS}$, e.g., if a ratio between the number of data bits 120 (FIG. 1) and the number $L_{CWS}$ is an integer; or a number of bits, which is less than the number $L_{CWS}$, e.g., if the ratio between the number of data bits 120 (FIG. 1) and the number $L_{CWS}$ is not an integer.

In some demonstrative embodiments, check-code bits 211, 213, 215, 217, 219 and 221 may include low-density parity-check (LDPC) bits (also referred to as "parity" bits) corresponding to data blocks 210, 212, 214, 216, 218 and 220, respectively, e.g., as described below. In other embodiments, check-code bits 211, 213, 215, 217, 219 and 221 may include bits of any other suitable check-code.

In some demonstrative embodiments, a data block of data blocks 210, 212, 214, 216, 218 and 220 may also include a set of repetition bits corresponding to the data bits of the data block. The set of repetition bits in the data block may include $N_{SHORT-SYM}$ bits, which are identical to at least a subset of the set of data bits in the data block, e.g., as described below. For example, data block 210 may include $N_{SHORT-SYM}$ repetition bits 241 identical to at least a subset of data bits 240; data block 212 may include $N_{SHORT-SYM}$ repetition bits 243 identical to at least a subset of data bits 242; data block 214 may include $N_{SHORT-SYM}$ repetition bits 245 identical to at least a subset of data bits 244; data block 216 may include $N_{SHORT-SYM}$ repetition bits 247 identical to at least a subset of data bits 246; data block 218 may include $N_{SHORT-SYM}$ repetition bits 249 identical to at least a subset of data bits 248; and data block 220 may include repetition bits 251 identical to at least a subset of data bits 250. Repetition bits 251 may include a number of bits, which is equal to the number $N_{SHORT-SYM}$, e.g., if data bits 250 include $L_{CWS}$ bits; or a number of bits, which is greater than the number $N_{SHORT-SYM}$, e.g., if data bits 250 include more than $L_{CWS}$ bits.

In some demonstrative embodiments, codewords 260, 261, 262, 263, 264 and 265 may have a bit-size, which is equal to or less than the symbol bit-size of symbols 200. Accordingly, codewords 260, 261, 262, 263, 264 and 265 may be distributed to the sequence of symbols 200 such that a symbol of the sequence of symbols 200 may include at least one codeword of the $N_{CW}$ codewords. Therefore, the symbol may include at least one data block and at least one plurality of check-code bits corresponding to the at least one data block, respectively.

In some demonstrative embodiments, one or more symbols of symbols 200 may include an integer number of codewords and/or one or more symbols may include a non-integer number of codewords, e.g., if one or more codewords are divided between consecutive symbols. For example, as shown in FIG. 2, symbol 202 may include codeword 260 and a first portion of codeword 261; symbol 204 may include a second portion of codeword 261, codeword 262 and a first portion of codeword 263; symbol 206 may include a second portion of codeword 263 and codeword 264; and symbol 208 may include codeword 265.

In some demonstrative embodiments, symbol 208 may be "padded" by one or more padding bits 223, e.g., zero bits, for example, in order to fit the plurality of codewords and/or data blocks resulting from data bits 120 (FIG. 1) into an integer number of symbols 200.

In other embodiments, the number $N_{SHORT-SYM}$ and/or the number $L_{CWS}$ may be determined, e.g., by wireless communication unit 104 (FIG. 1), such that a reduced number of padding bits, e.g., no padding bits, are required. For example, the number $N_{SHORT-SYM}$ and/or the number $L_{CWS}$ may be determined, e.g., by wireless communication unit 104 (FIG. 1), such that, for example, one or more of the padding bits may be replaced by one or more respective repetition bits to be distributed between one or more of the codewords, e.g., as described in detail below.

Referring back to FIG. 1, in some demonstrative embodiments, wireless communication unit 104 may be capable of determining the number $L_{CWS}$, determining the number $N_{SHORT-SYM}$ and/or distributing data bits 120 to the sequence of symbols 200 (FIG. 2) based on the number $N_{Data}$ of data bits 120, the symbol bit-size $N_{CBPS}$ of symbols 200 (FIG. 2), the data-block bit-size of the data blocks, the number of the plurality of check-code bits, the check-code rate R, and/or the codeword bit-size $L_{CW}$, e.g., as described in detail below. The data-block bit-size of the data blocks and/or the number of the plurality of check-code bits may be represented by, and/or determined based on, any one or more other suitable parameters, e.g., the codeword bit-size $L_{CW}$ and the check-code rate R, as described above.

In some demonstrative embodiments, transmitter 106 may include a block generator 110 to generate a sequence of check-code blocks 124, including a respective sequence of sets of data bits, e.g., by distributing data bits 120 to $N_{CW}$ check-code blocks. For example, block generator 110 may distribute data bits 120 to $N_{CW}$ check-code blocks 124, wherein each check code block 124 includes a respective set of data bits of the $N_{CW}$ sets of data bits, e.g., including data bits 240, 242, 244, 246, 248 and 250 (FIG. 2).

In some demonstrative embodiments, transmitter 106 may also include an encoder 114 to generate a sequence of codewords 126 by encoding check-code blocks 124. For example, encoder 114 may append to check-code blocks 124 respective pluralities of check-code bits. In one embodiment, e.g., as described herein, codewords 126 may include LDPC codewords, and encoder 114 may include any suitable LDPC encoder. However, in other embodiments, encoder 114 may include any other suitable encoder.

In some demonstrative embodiments, block generator 110 may determine the number $N_{CW}$ of codewords/data blocks to be included in the sequence of symbols 200 (FIG. 2) based on the number $N_{Data}$ of data bits 120, and the data block bit-size, e.g., using the check-code rate R and the codeword bit-size $L_{CW}$. For example, block generator 110 may determine the number $N_{CW}$ as follows:

$$N_{CW} = \left\lceil \frac{N_{data}}{L_{CW} \times R} \right\rceil \tag{1}$$

wherein the notation $\lceil \ \rceil$ denotes a mathematical ceiling function, for example, such that $\lceil x \rceil$ is equal to the smallest integer, which is not less than x, e.g., $\lceil x \rceil = 2$, if $1 < x \leq 2$.

In some demonstrative embodiments, block generator 110 may determine the number $N_{SYM}$ of symbols to be included in the sequence of symbols 200 (FIG. 2) based on the number $N_{CW}$, the symbol bit-size $N_{CBPS}$, and the data block bit-size. For example, block generator 110 may determine the number $N_{SYM}$ as follows:

$$N_{SYM} = \left\lceil \frac{N_{CW} \times L_{CW} \times R}{N_{CBPS}} \right\rceil \tag{2}$$

In some demonstrative embodiments, block generator 110 may determine a total number of repetition bits, denoted $N_{REP}$, based on the number $N_{data}$ of data bits 120, the number $N_{SYM}$ of symbols 200 (FIG. 2), the check-code rate R and the symbol bit-size $N_{CBPS}$. For example, block generator 110 may determine the number $N_{REP}$ as follows:

$$N_{REP} = N_{SYM} \times N_{CBPS} \times R - N_{data} \tag{3}$$

In some demonstrative embodiments, block generator 110 may determine the number $N_{SHORT-SYM}$ of repetition bits to be included in a codeword based on the total number $N_{REP}$ of repetition bits and the number $N_{CW}$. For example, block generator 110 may determine the number $N_{SHORT-SYM}$ as follows:

$$N_{SHORT-SYM} = \left\lfloor \frac{N_{REP}}{N_{CW}} \right\rfloor \quad (4)$$

wherein the notation $\lfloor \; \rfloor$ denotes a mathematical floor function, for example, such that $\lfloor x \rfloor$ is equal to the largest integer, which is not greater than x, e.g., $\lfloor x \rfloor = 1$, if $1 \leq x < 2$.

In some demonstrative embodiments, block generator 110 may generate check-code blocks 124, such that each check-code block includes a respective set of data bits 120 and a plurality of zero bits, wherein a number of the zero bits is equal to the number of repetition bits to be included in a data block including the set of data bits.

In some demonstrative embodiments, block generator 110 may determine the number $L_{CWS}$ of data bits to be included in each data block based on the codeword bit-size $L_{CW}$, the check-code rate R, the number $N_{SHORT-SYM}$, the number $N_{CW}$ and/or the number $N_{REP}$.

For example, block generator 110 may determine the number $L_{CWS}$ of data bits to be included in each of data blocks 210, 212, 214, 216 and 218 (FIG. 2), e.g., as follows:

$$L_{CWS} = R \times L_{CW} - N_{SHORT-SYM} \quad (5)$$

Block generator 110 may determine a number $L_{CWSL}$ of data bits to be included in data block 220, e.g., if as follows:

$$L_{CWSL} = L_{CWS} - N_{REP} \bmod(N_{CW}) \quad (6)$$

wherein the notation "mod" refers to the mathematical modulo operation, which determines the remainder of a division operation.

In some demonstrative embodiments, block generator 110 may generate check-code blocks 124 by distributing data bits 120 into $N_{CW}$ blocks, wherein an m-th, $m < N_{CW}$, check-code block 124 includes $L_{CWS}$ bits of data bits 120, which are followed by $N_{SHORT-SYM}$ zero bits, e.g., as follows:

$$(b_1^{(m)}, b_2^{(m)}, \ldots, b_{L_{CWS}}^{(m)}, 0 \ldots 0) \quad (7)$$

wherein $b_x^{(y)}$ denotes an x-th bit in a y-th set of bits of data bits 120;
and wherein the last check-code block of clocks 124 includes the $L_{CWSL}$ bits of data bits 120, which are followed by $N_{SHORT-SYM} + N_{REP} \bmod(N_{CW})$ zero bits:

$$(b_1^{(N_{CW})}, b_2^{(N_{CW})}, \ldots, b_{L_{CWSL}}^{(N_{CW})}, 0 \ldots 0) \quad (8)$$

In one example, block generator 110 may generate $N_{CW}$ check-code blocks 124 having the bit-size of $N_{CW}$ data blocks 210, 212, 214, 216, 218 and 220 (FIG. 2), respectively. For example, a first check-code block 124 may include data bits 240 followed by $N_{SHORT-SYM}$ zero bits, a second check-code block 124 may include data bits 242 followed by $N_{SHORT-SYM}$ zero bits, a third check-code block 124 may include data bits 244 followed by $N_{SHORT-SYM}$ zero bits, a fourth check-code block 124 may include data bits 246 followed by $N_{SHORT-SYM}$ zero bits, a fifth check-code block 124 may include data bits 248 followed by $N_{SHORT-SYM}$ zero bits, and a $N_{CW}$-th check-code block 124 may include data bits 250 followed by $N_{SHORT-SYM} + N_{REP} \bmod(N_{CW})$ zero bits.

In some demonstrative embodiments, encoder 114 may generate codewords 126 by encoding check-code blocks 124. For example, encoder 114 may append to check-code blocks 124 respective pluralities of $n-k=L_{CW} \times (1-R)$ check-code bits, which me determined by applying any suitable check-code generation scheme, e.g., a suitable LDPC check-code scheme, to check-code blocks 124.

For example, encoder 114 may generate the m-th codeword 126, denoted $c^{(m)}$, by appending to the m-th check-code block 124 the n–k parity bits, denoted $(P_1^{(m)}, P_2^{(m)}, \ldots, P_{n-k}^{(m)})$, corresponding the m-th check-code block 124, e.g., as follows:

$$c^{(m)} = (b_1^{(m)}, b_2^{(m)}, \ldots, b_{LCSW}^{(m)}, 0 \ldots 0, P_1^{(m)}, P_2^{(m)}, \ldots, P_{n-k}^{(m)}) \quad (9)$$

and encoder 114 may generate the last codeword of codewords 126 to include the following bits:

$$c^{(N_{CW})} = (b_1^{(N_{CW})}, b_2^{(N_{CW})}, \ldots, b_{LCWSL}^{(N_{CW})}, 0 \ldots 0, P_1^{(N_{CW})}, P_2^{(N_{CW})}, \ldots, P_{n-k}^{(N_{CW})}) \quad (10)$$

In some demonstrative embodiments, transmitter 106 may also include a replacer 116 to receive from block generator 110 a plurality of sets of repetition bits 122 corresponding to the plurality of codewords 126, e.g., $N_{CW}$ sets of repetition bits 122 corresponding to the $N_{CW}$ codewords 126, respectively.

In some demonstrative embodiments, block generator 110 may generate the $N_{ov}$ sets of repetition bits 122 based on the data bits of the $N_{CW}$ check-code blocks 124, respectively. For example, a set of repetition bits 122 corresponding to a check-code block 124 may include a subset of the data bits in the check-code block 124, e.g., the first $N_{SHORT-SYM}$ bits of the data bits in the check-code block 124 or any other suitable subset of the data bits.

In one example, the set of repetition bits 122 corresponding to the m-th check code block 124 may include the bits $(b_1^{(m)}, b_2^{(m)}, \ldots, b_{N_{SHORT-SYM}}^{(m)})$, and the set of repetition bits 122 corresponding to the $N_{CW}$-th check code block 124 may include the bits $(b_1^{(N_{CW})}, b_2^{(N_{CW})}, \ldots, b_{N_{SHORT-SYM}+N_{REP} \bmod N_{CW}}^{(N_{CW})})$.

In some demonstrative embodiments, the set of repetition bits 122 corresponding to the $N_{CW}$-th check-code block 124 may include more than one repetition of one or more of the data bits in the $N_{CW}$-th check-code block 124, e.g., a cyclic repetition of the data bits or any other suitable repetition, for example, if the number of data bits in the $N_{CW}$-th check-code block is less than the number $N_{SHORT-SYM}$.

In some demonstrative embodiments, replacer 116 may generate codewords 128 by replacing the zero bits of the m-th codeword 126 with the corresponding set of $N_{SHORT-SYM}$ repetition bits 122, such that the resulting m-th codeword 128, denoted $d^{(m)}$, may include the bits:

$$d^{(m)} = (b_1^{(m)}, b_2^{(m)}, \ldots, b_{LCWS}^{(m)}, b_1^{(m)}, b_2^{(m)}, \ldots b_{N_{SHORT-SYM}}^{(m)}, P_1^{(m)}, P_2^{(m)}, \ldots, P_{n-k}^{(m)}) \quad (11)$$

and replacer 116 may generate the last codeword of codewords 128 to include the following bits:

$$d^{(N_{CW})} = \begin{pmatrix} b_1^{(N_{CW})}, b_2^{(N_{CW})}, \ldots, b_{LCWSL}^{(N_{CW})}, b_1^{(N_{CW})}, \\ b_2^{(N_{CW})}, \ldots, b_{N_{SHORT-SYM}+N_{REP} \bmod N_{CW}}^{(N_{CW})}, \\ P_1^{(N_{CW})}, P_2^{(N_{CW})}, \ldots, P_{n-k}^{(N_{CW})} \end{pmatrix} \quad (12)$$

In one example, codewords 128 may include codewords 260, 261, 262, 263, 264 and 265 (FIG. 2). For example, replacer 116 may receive from encoder 114 the first codeword 126 including data bits 240 (FIG. 2), $N_{SHORT-SYM}$ zero bits and parity bits 211 (FIG. 2); the second codeword 126 including data bits 242 (FIG. 2), $N_{SHORT-SYM}$ zero bits and parity bits 213 (FIG. 2); the third codeword 126 including data bits 244 (FIG. 2), $N_{SHORT-SYM}$ zero bits and parity bits 215 (FIG.

2); the fourth codeword 126 including data bits 246 (FIG. 2), $N_{SHORT-SYM}$ zero bits and parity bits 217 (FIG. 2); the fifth codeword 126 including data bits 248 (FIG. 2), $N_{SHORT-SYM}$ zero bits and parity bits 217 (FIG. 2); and the last codeword 126 including data bits 250 (FIG. 2), $N_{SHORT-SYM}+N_{REP}$ mod ($N_{CW}$) zero bits and parity bits 221 (FIG. 2). Replacer 116 may also receive from block generator 110 the sets of repetition bits 241, 243, 245, 247 and 249 (FIG. 2), which may include, for example, the first $N_{SHORT-SYM}$ bits of data bits 240, 242, 244, 246 and 248 (FIG. 2), respectively; and the set of repetition bits 251 (FIG. 2), which may include, for example, the $N_{SHORT-SYM}+N_{REP}$ mod($N_{CW}$) bits of data bits 250 (FIG. 2). Replacer 116 may generate codewords 128 by replacing the zero bits of the fist, second third, fourth, fifth and last codewords 126 with repetition bits 241, 243, 245, 247, 249 and 251 (FIG. 2), respectively.

Some demonstrative embodiments, e.g., as described above, include generating the check-code bits by encoding the data bits, e.g., while not encoding the repetition bits. However, in other embodiments, transmitter 106 may be capable of determining the check-code bits of each codeword based on a check-code block, which includes the set of data bits and the set of repetition bits, e.g., as described in detail below.

In some demonstrative embodiments, block generator 110 may generate check-code blocks 124 including the data blocks 210, 212, 214, 216, 218 and 220 (FIG. 2). For example, block generator 110 may generate check-code blocks 124 by distributing data bits 120 into $N_{CW}$ blocks, wherein the m-th check-code block 124 includes the bits $(b_1^{(m)}, b_2^{(m)}, \ldots, b_{LCWS}^{(m)}, b_1^{(m)}, b_2^{(m)}, \ldots, b_{N_{SHORT-SYM}}^{(m)})$; and the last check-code block of clocks 124 includes the bits $(b_1^{(M_{CW})}, b_2^{(N_{CW})}, \ldots, b_{LCWS}^{(N_{CW})}, \ldots, b_{LWCS}^{(N_{CW})}, b_1^{(N_{CW})}, b_2^{(N_{CW})}, \ldots, b_{N_{SHORT-SYM}+N_{REP} mod N_{CW}}^{(N_{CW})})$.

According to these embodiments, encoder 114 may determine check-code bits 211, 213, 215, 217, 219 and 221 (FIG. 2) based on both the data bits and repetition bits of each of data blocks 210, 212, 214, 216, 218 and 220 (FIG. 2), respectively.

In one non-limiting example, data bits 120 may include 576 bits, e.g., 72 bytes, each including eight bits; the symbol bit-size may be $N_{CBPS}=672$ bits; the codeword bit-size may be $L_{CW}=672$ bits; and the check-code rate may be R=0.75. According to this example, block generator 110 may determine the number $N_{CW}=2$, e.g., according to Equation 1; the number $N_{SYM}=2$, e.g., according to Equation 2; the number $N_{REP}=432$, e.g., according to Equation 3; and/or the number $N_{SHORT-SYM}=216$, e.g., according to Equation 4.

In some demonstrative embodiments, transmitter 106 may pad symbol 208 (FIG. 2) by one or more padding bits 223, e.g., zero bits, for example, in order to fit the plurality of codewords and/or data blocks resulting from data bits 120 into an integer number of symbols 200 (FIG. 2). However, in other embodiments, block generator 110 may determine the number $N_{SHORT-SYM}$ and/or the number $L_{CWS}$ such that a reduced number of padding bits, e.g., no padding bits, may be required. For example, one or more of the padding bits may be replaced by one or more respective repetition bits to be distributed between one or more of the codewords, e.g., as described in detail below.

In some demonstrative embodiments, block generator 110 may determine the number $N_{CW}$ of codewords/data blocks to be included in the sequence of symbols 200 (FIG. 2) based on Equation 1; and the number $N_{SYM}$ of symbols to be included in the sequence of symbols 200 (FIG. 2) based on Equation 2.

In some demonstrative embodiments, block generator 110 may determine the number $N_{SHORT-SYM}$ of repetition bits, such that a required number of padding bits 223 may be reduced. For example, block generator 110 may determine the number $N_{SHORT-SYM}$ of repetition bits based on the number $N_{data}$ of the transmitted data bits, the number $N_{CW}$ of data blocks, the number $N_{SYM}$ of symbols, the symbol bit-size $N_{CBPS}$, the check-code rate R, and/or the codeword bit-size $L_{CW}$, e.g., as described below.

In some demonstrative embodiments, block generator 110 may determine the number of repetition bits $N_{REP}$ based on the number $N_{data}$ of the transmitted data bits, the number $N_{CW}$ of data blocks, and the data-block bit-size, e.g., which may be determined based on the check-code rate R and the codeword bit-size $L_{CW}$. For example, block generator 110 may determine the number of repetition bits $N_{REP}$ as follows:

$$N_{REP}=N_{CW} \times L_{CW} \times R - N_{data} \quad (13)$$

In some demonstrative embodiments, block generator 110 may determine a first intermediate number $N_{REP-SYM}$ of repetition bits to be included in a data block based on the number $N_{REP}$ and the number $N_{CW}$. For example, block generator 110 may determine the number $N_{REP-SYM}$ as follows:

$$N_{REP-SYM} = \left\lfloor \frac{N_{REP}}{N_{CW}} \right\rfloor \quad (14)$$

In some demonstrative embodiments, if the value $N_{REP-SYM}$ is zero according to Equation 14, then for one or more of check code-blocks 124, block generator 110 may round-up the value of $N_{REP-SYM}$ to one, and for one or more other check code-blocks 124, block generator 110 may maintain the value of $N_{REP-SYM}$ as zero.

In some demonstrative embodiments, block generator 110 may determine a total number of padding bits, denoted $N_{PAD}$, based on the number of symbols, the symbol bit-size and the number of repetition bits. For example, block generator 110 may determine the number $N_{PAD}$ as follows:

$$N_{PAD}=N_{SYM} \times N_{CRPS} - N_{REP} \quad (15)$$

In some demonstrative embodiments, block generator 110 may determine a second intermediate number, denoted $N_{PAD-SYM}$, of "padding bits" to be distributed to the data block, based on a ratio between the total number of pad-bits and the number of data blocks. For example, block generator 110 may determine the number $N_{PAD-SYM}$ as follows:

$$N_{PAD-SYM} = \left\lfloor \frac{N_{PAD}}{N_{CW}} \right\rfloor \quad (16)$$

In some demonstrative embodiments, if the value $N_{PAD-SYM}$ is zero according to Equation 16, then for one or more of check code-blocks 124, block generator 110 may round-up the value of $N_{PAD-SYM}$ to one, and for one or more other check code-blocks 124, block generator 110 may maintain the value of $N_{PAD-SYM}$ as zero.

In some demonstrative embodiments, block generator 110 may determine the number $N_{SHORT-SYM}$ of repetition bits 241, 243, 245, 247, 249 and 251 (FIG. 2) to be included in each of codewords 260, 261, 262, 263, 264 and 265 (FIG. 2), respectively, based on the sum of the numbers $N_{PAD-SYM}$ and $N_{REP-SYM}$, e.g., as follows:

$$N_{SHORT-SYM}=N_{REP-SYM}+N_{PAD-SYM} \quad (17)$$

In some demonstrative embodiments, a set of repetition bits 122 corresponding to a check-code block 124 may include a first subset of $N_{REP-SYM}$ bits of the data bits in the check-code block 124, e.g., the first $N_{REP-SYM}$ bits of the data bits in the check-code block 124 or any other suitable subset of the data bits; and a second subset of $N_{PAD-SYM}$ bits of the data bits in the check-code block 124, e.g., consecutive to the first $N_{REP-SYM}$ bits or any other suitable subset of the data bits.

In some demonstrative embodiments, block generator 110 may generate check-code blocks 124 including the data blocks 210, 212, 214, 216, 218 and 220 (FIG. 2). For example, block generator 110 may generate check-code blocks 124 by distributing data bits 120 into $N_{CW}$ blocks, wherein the m-th check-code block 124 includes the bits $(b_1^{(m)}, b_2^{(m)}, \ldots, b_{LCWS}^{(m)}, b_1^{(m)}, b_2^{(m)}, \ldots, b_{N_{REP-SYM}}^{(m)})$; and the last check-code block of clocks 124 includes the bits $(b_1^{(N_{CW})}, b_2^{(N_{CW})}, \ldots, b_{LCWS}^{(N_{CW})}, b_1^{(N_{CW})}, b_2^{(N_{CW})}, \ldots, b_{N_{REP-SYM}+N_{REP}mod(N_{CW})}^{(N_{CW})})$. According to these embodiments, encoder 114 may determine check-code bits 211, 213, 215, 217, 219 and 221 (FIG. 2) based on both the data bits and the $N_{REP}$ repetition bits of each of data blocks 210, 212, 214, 216, 218 and 220 (FIG. 2), respectively. Replacer 116 may append to a codeword of codewords 126, e.g., at the end of the codeword, the second subset of $N_{PAD-SYM}$ bits of the data bits in the corresponding check-code block 124. In the last codeword 126 the padding bits 223 in locations $L_{CWSL}+1$ through $L_{CW} \times R$ may be replaced with bits $(b_1^{(N_{CW})}, b_2^{(N_{CW})}, \ldots, b_{N_{REP-SYM}+N_{REP}mod(N_{CW})}^{(N_{CW})})$.

In some demonstrative embodiments, transmitter 106 may include any suitable one or more Tx elements 118, e.g., OFDM TX elements, to transmit codewords 128 as a sequence of symbols, e.g., symbols 200 (FIG. 2).

In some demonstrative embodiments, receiver 154 may include any suitable one or more Rx elements 156, e.g., OFDM Rx elements, to receive the sequence of symbols 158, e.g., symbols 200 (FIG. 2), from device 102.

In some demonstrative embodiments, receiver 154 may also include a replacer 160 capable of distributing the data bits of the received symbols 158 into a sequence of codewords 162. Replacer 160 may also evaluate the data bits of a codeword based on the repetition bits corresponding to the codeword. For example, replacer 160 may determine the values of data bits 240 (FIG. 2) based on repetition bits 241 (FIG. 2). In one example, replacer 160 may apply a suitable average-likelihood algorithm. For example, replacer 160 may replace the value of a data bit 240 (FIG. 2) with an average of the data bit and the repetition bit 241 (FIG. 2) corresponding to the data bit. In some demonstrative embodiments, replacer 160 may also replace the repetition bits of the codewords with zero bits, e.g., to generate codewords 162, e.g., similar to codewords 126.

In some demonstrative embodiments, receiver 154 may include a decoder 164 to generate a sequence of check-code blocks 166 by decoding codewords 162. In one embodiment, e.g., as described herein, codewords 162 may include LDPC codewords, and decoder 164 may include any suitable LDPC encoder. However, in other embodiments, decoder 164 may include any other suitable decoder.

In some demonstrative embodiments, receiver 154 may also include a data bit generator 168 to generate a plurality of received data bits 170, e.g., corresponding to data bits 120. For example, generator 168 may remove the zero bits and/or repetition bits from check-code blocks 166. Data bits 170 may be provided to any suitable component of device 150, e.g., to any suitable Rx element 172 of receiver 106. In one example, data bits 170 may be provided to a suitable descrambler 173. Data bits 170 may be utilized to generate any suitable output data 171, which may be provided to any suitable component of device 150, e.g., processor 182, memory 178 and/or storage 180.

Figure 3:
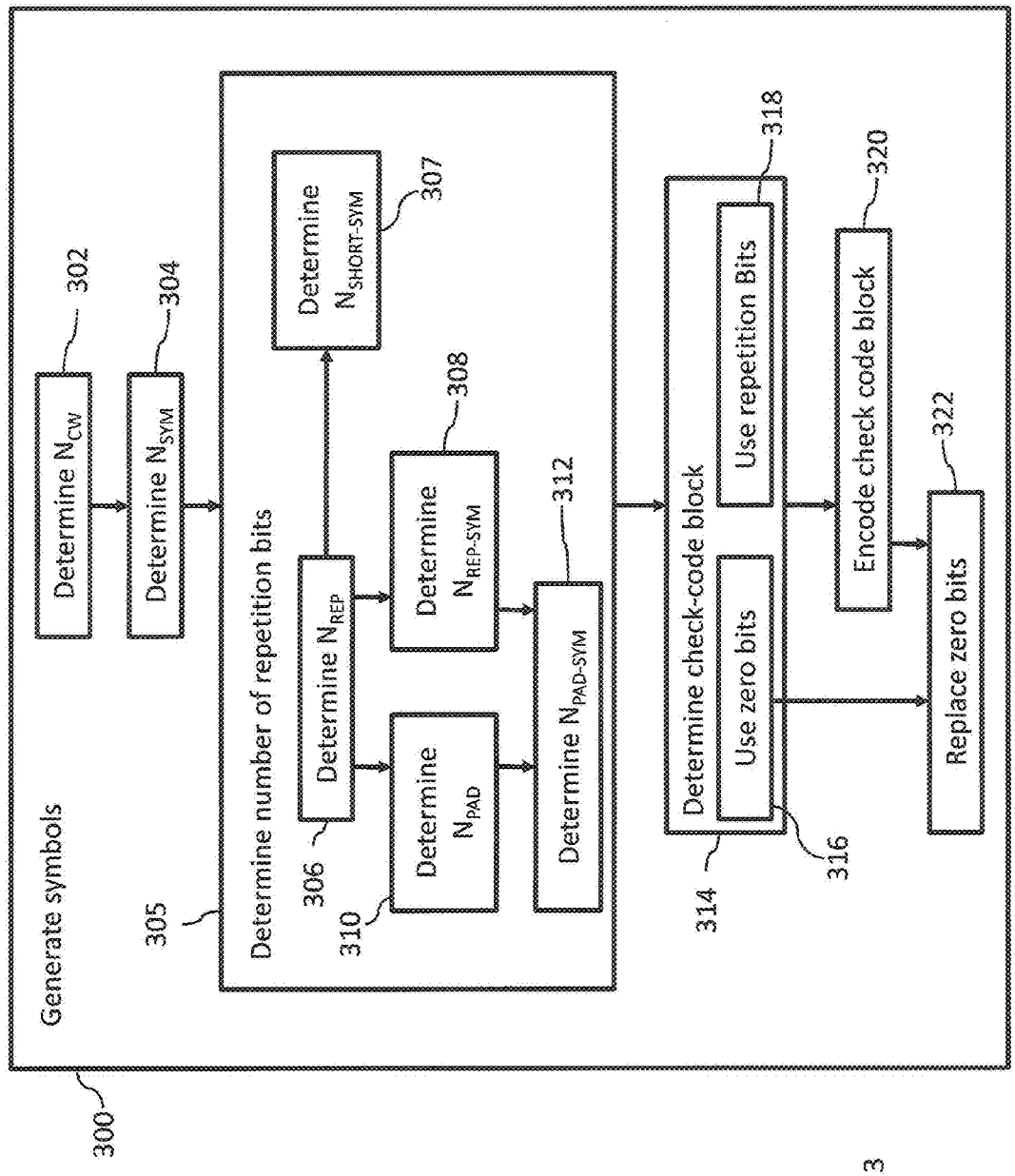
FIG. 3 is a schematic illustration of a method of communicating data over wireless communication symbols, in accordance with some demonstrative embodiments.

Reference is now made to FIG. 3, which schematically illustrates a method of communicating data over wireless communication symbols, in accordance with some demonstrative embodiments. In some demonstrative embodiments, one or more operations of the method of FIG. 3 may be implemented by one or more elements of a system, e.g., system 100 (FIG. 1), a wireless communication device, e.g., devices 102 and/or 150 (FIG. 1), a transmitter, e.g., transmitter 106 (FIG. 1), and/or a receiver, e.g., receiver 154 (FIG. 1).

As indicated at block 300, the method may include generating a sequence of wireless communication symbols representing transmitted data bits. A symbol, e.g., symbol 202 (FIG. 2) of the symbols may include at least one data block, e.g., data block 210 (FIG. 2), which includes a set of data bits, e.g., data bits 240 (FIG. 2), and a set of repetition bits, e.g., repetition bits 241 (FIG. 2), the set of data bits including a first number of the transmitted data bits, and the set of repetition bits including a second number of bits, which are identical to at least a subset of the set of data bits. The symbol may also include at least one plurality of check-code bits, e.g., parity bits 211 (FIG. 2), corresponding to the at least one data block, respectively. The first and second numbers may be based on a number of the transmitted data bits, a symbol bit-size of the symbol, at least one value related to at least one of a data-block bit-size of the data block and a number of the plurality of check-code bits, e.g., as described above.

As indicated at block 302, the method may include determining a number of data blocks to be included in the sequence of symbols based on the number of the transmitted data bits and the at least one value. For example, wireless communication unit 104 (FIG. 1) may determine the number $N_{CW}$, e.g., as described above.

As indicated at block 304, the method may include determining a number of symbols in the sequence of symbols based on the number of data blocks and the symbol bit-size. For example, wireless communication unit 104 (FIG. 1) may determine the number $N_{SYM}$, e.g., as described above.

As indicated at block 305, the method may include determining the number of repetition bits to be included in the symbol.

In some embodiments, determining the number of repetition bits to be included in the symbol may include determining a total number of repetition bits, as indicated at block 306; and determining the number of repetition bits to be included in the symbol based on the total number of repetition bits and the number of data blocks, as indicated at block 307. For example, wireless communication unit 104 (FIG. 1) may determine the number $N_{REP}$, e.g., based on Equation 3, and the number $N_{SHORT-SYM}$, e.g., based on Equation 4, as described above.

In other embodiments, determining the number of repetition bits to be included in the symbol may include determining the number of repetition bits to be included in the symbol based on the number of the transmitted data bits, the number of symbols and the symbol bit-size. For example, determining the number of repetition bits to be included in the symbol may include determining a total number of repetition bits, as indicated at block 306; determining a total number of padding bits based on the number of symbols, the symbol bit-size and the total number of repetition bits, as indicated at block 310; determining a first intermediate number based on a ratio between the total number of repetition bits and the number of data blocks, as indicated at bock 308; determining a second intermediate number based on a ratio between the total number of pad-bits and the number of data blocks, as indicated at block 312; and determining the second number based on the sum of the first and second intermediate numbers. For example, wireless communication unit 104 (FIG. 1) may determine the numbers $N_{REP-SYM}$, $N_{PAD-SYM}$ and $N_{SHORT-SYM}$, e.g., based on Equations 13, 14, 15, 16t and/or 17, as described above.

As indicated at block 314, the method may include generating a check-code block including the check-code bits.

As indicated at block 316, in some embodiments, generating the check-code block may include generating a check-code block including the set of data bits and a plurality of zero bits, wherein a number of the zero bits is equal to the second number, e.g., as described above.

As indicated at block 318, in other embodiments, generating the check-code block may include generating a check-code block including the set of data bits and the set of repetition bits, e.g., as described above.

As indicated at block 320, the method may include encoding the check-code block. For example, encoder 114 (FIG. 1) may encode check-code blocks 124 (FIG. 1), e.g., as described above. Encoding the check-code block may include generating an encoded block, which includes the set of data bits, the plurality of zero bits and the check-code bits, e.g., if the check-code block includes the set of data bits and a plurality of zero bits. Encoding the check-code block may include generating the encoded block, which includes the set of data bits, the set of repetition bits and the check-code bits, e.g., if the check-code block includes the set of data bits and the set of repetition bits.

As indicated at block 322, the method may include replacing the plurality of zero bits with the set of repetition bits, e.g., if the check-code block includes the set of data bits and a plurality of zero bits.

Figure 4:
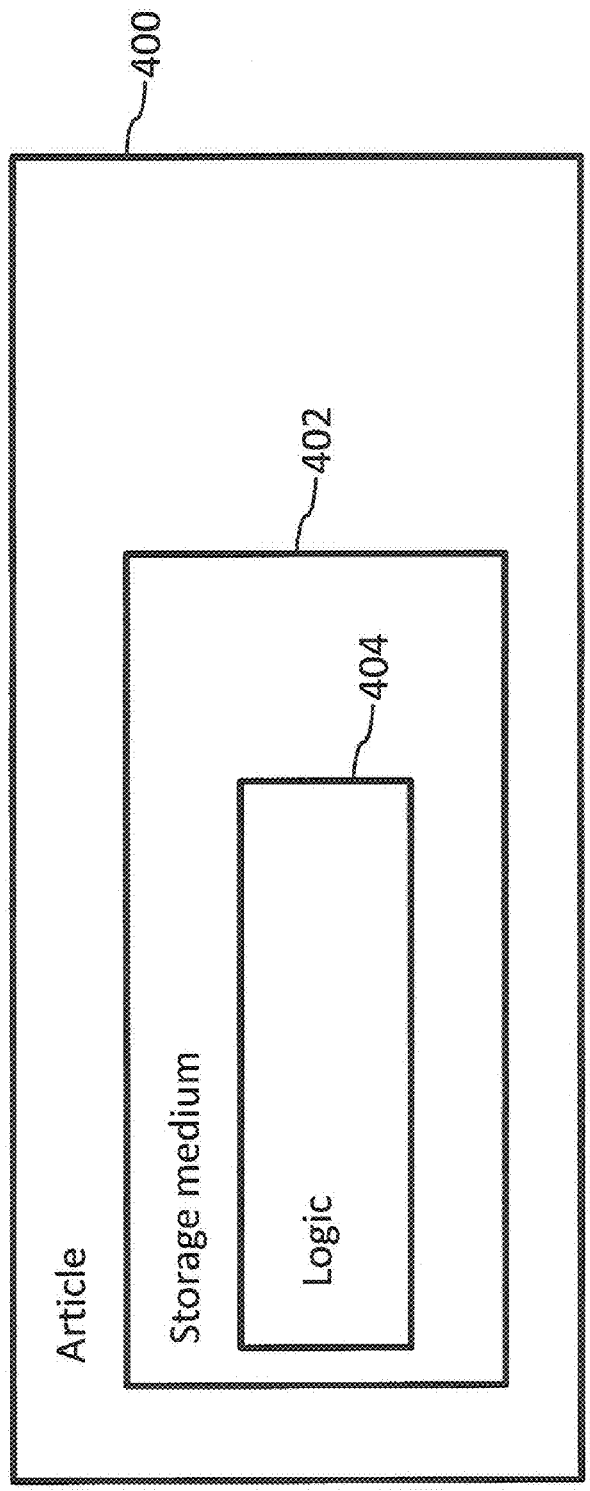
FIG. 4 is a schematic illustration of an article of manufacture, in accordance with some demonstrative embodiments.
Figure 1:
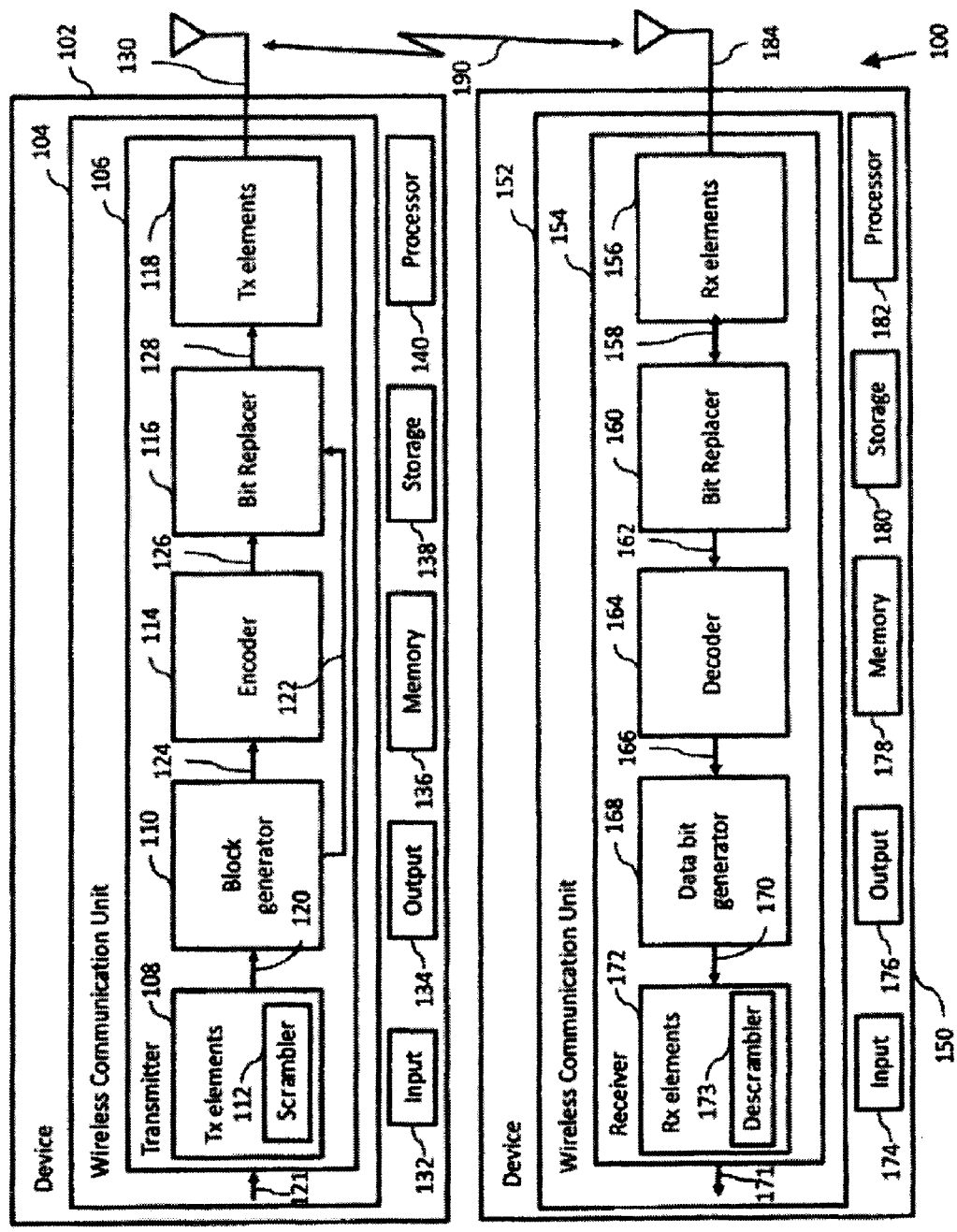

Reference is made to FIG. 4, which schematically illustrates an article of manufacture 400, in accordance with some demonstrative embodiments. Article 400 may include a machine-readable storage medium 402 to store logic 404, which may be used, for example, to perform at least part of the functionality of wireless communication unit 104 (FIG. 1), wireless communication device 102 (FIG. 1), wireless communication unit 152 (FIG. 1), wireless communication device 150 (FIG. 1), transmitter 106 (FIG. 1), and/or receiver 154 (FIG. 1); and/or to perform one or more operations of the method of FIG. 3.

In some demonstrative embodiments, article 400 and/or machine-readable storage medium 402 may include one or more types of computer-readable storage media capable of storing data, including volatile memory, non-volatile memory, removable or non-removable memory, erasable or non-erasable memory, writeable or re-writeable memory, and the like. For example, machine-readable storage medium 402 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 404 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 404 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A wireless communication device including:

a wireless communication unit to transmit a sequence of wireless communication symbols representing transmitted data bits, wherein a symbol of the symbols includes at least one data block, which includes a set of data bits and a set of repetition bits, the set of data bits including a first number of the transmitted data bits, and the set of repetition bits including a second number of bits, which are identical to at least a subset of the set of data bits, wherein the symbol includes at least one plurality of check-code bits corresponding to the at least one data block, respectively, wherein the wireless communication unit is to determine the check-code bits based on a check-code block including the set of data bits and a plurality of zero bits, and wherein a number of the zero bits is equal to the second number, and wherein the first and second numbers are based on a number of the transmitted data bits, a symbol bit-size of the symbol, and at least one value related to at least one of a data-block bit-size of the data block and a number of the plurality of check-code bits.

2. The wireless communication device of claim 1, wherein the wireless communication unit includes:
    a block generator to generate the check-code block;
    a check-code encoder to generate an encoded block based on the check-code block, wherein the encoded block includes the set of data bits, the plurality of zero bits and the check-code bits; and
    a replacer to replace the plurality of zero bits with the set of repetition bits.

3. The wireless communication device of claim 2, wherein the replacer is to receive the set of repetition bits from the block generator.

4. The wireless communication device of claim 1, wherein the check-code block includes the set of data bits and the set of repetition bits.

5. The wireless communication device of claim 1, wherein the wireless communication unit includes:
    a block generator to generate the check-code block; and
    a check-code encoder to generate an encoded block based on the check-code block, wherein the encoded block includes the set of data bits, the set of repetition bits and the check-code bits.

6. The wireless communication device of claim 1, wherein the wireless communication unit is to determine a number of data blocks to be included in the sequence of symbols based on the number of the transmitted data bits and the at least one value; to determine a number of symbols in the sequence of symbols based on the number of data blocks and the symbol bit-size; to determine a total number of repetition bits based on the number of the transmitted data bits, the number of symbols and the symbol bit-size; and to determine the second number based on the total number of repetition bits and the number of data blocks.

7. The wireless communication device of claim 1, wherein the wireless communication unit is to determine a number of data blocks to be included in the sequence of symbols based on the number of the transmitted data bits and the at least one value; to determine a number of symbols in the sequence of symbols based on the number of data blocks and the symbol bit-size; and to determine the second number based on the number of the transmitted data bits, the number of symbols and the symbol bit-size.

8. The wireless communication device of claim 7, wherein the wireless communication unit is to determine a total number of repetition bits based on the number of the transmitted data bits, the number of data blocks, and the at least one value; to determine a total number of padding bits based on the number of symbols, the symbol bit-size and the total number of repetition bits; to determine a first intermediate number based on a ratio between the total number of repetition bits and the number of data blocks; to determine a second intermediate number based on a ratio between the total number of pad-bits and the number of data blocks; and to determine the second number based on the sum of the first and second intermediate numbers.

9. The wireless communication device of claim 1, wherein the set of repetition bits includes a predefined subset of the set of data bits.

10. The wireless communication device of claim 1, wherein the sequence of symbols includes a sequence of orthogonal-frequency-division-multiplexing (OFDM) symbols.

11. The wireless communication device of claim 1, wherein the plurality of check-code bits includes a plurality of low-density parity-check (LDPC) bits.

12. A method including:
    generating a sequence of wireless communication symbols representing transmitted data bits,
    wherein a symbol of the symbols includes at least one data block, which includes a set of data bits and a set of repetition bits, the set of data bits including a first number of the transmitted data bits, and the set of repetition bits including a second number of bits, which are identical to at least a subset of the set of data bits,
    wherein the symbol includes at least one plurality of check-code bits corresponding to the at least one data block, respectively, wherein generating the sequence of wireless communication symbols includes determining the check-code bits based on a check-code block including the set of data bits and a plurality of zero bits, wherein a number of the zero bits is equal to the second number,
    and wherein the first and second numbers are based on a number of the transmitted data bits, a symbol bit-size of the symbol, and at least one value related to at least one of a data-block bit-size of the data block and a number of the plurality of check-code bits.

13. The method of claim 12 including:
    generating the check-code block;
    generating an encoded block based on the check-code block, wherein the encoded block includes the set of data bits, the plurality of zero bits and the check-code bits; and
    replacing the plurality of zero bits with the set of repetition bits.

14. The method of claim 12, wherein determining the check-code bits includes determining the check-code bits based on the check-code block, which includes the set of data bits and the set of repetition bits.

15. The method of claim 14 including:
    generating the check-code block; and
    generating an encoded block based on the check-code block, wherein the encoded block includes the set of data bits, the set of repetition bits and the check-code bits.

16. The method of claim 12 including:
    determining a number of data blocks to be included in the sequence of symbols based on the number of the transmitted data bits and the at least one value;
    determining a number of symbols in the sequence of symbols based on the number of data blocks and the symbol bit-size;
    determining a total number of repetition bits based on the number of the transmitted data bits, the number of symbols and the symbol bit-size; and
    determining the second number based on the total number of repetition bits and the number of data blocks.

17. The method of claim 12 including:
    determining a number of data blocks to be included in the sequence of symbols based on the number of the transmitted data bits and the at least one value;
    determining a number of symbols in the sequence of symbols based on the number of data blocks and the symbol bit-size; and
    determining the second number based on the number of the transmitted data bits, the number of symbols and the symbol bit-size.

18. The method of claim 17 including:
    determining a total number of repetition bits based on the number of the transmitted data bits, the number of data blocks, and the at least one value;
    determining a total number of padding bits based on the number of symbols, the symbol bit-size and the total number of repetition bits;

determining a first intermediate number based on a ratio between the total number of repetition bits and the number of data blocks;

determining a second intermediate number based on a ratio between the total number of pad-bits and the number of data blocks; and determining the second number based on the sum of the first and second intermediate numbers.

19. A wireless communication system including:

a first wireless communication device to transmit to a second wireless communication device a sequence of wireless communication symbols representing transmitted data bits, wherein a symbol of the symbols includes at least one data block, which includes a set of data bits and a set of repetition bits, the set of data bits including a first number of the transmitted data bits, and the set of repetition bits including a second number of bits, which are identical to at least a subset of the set of data bits, wherein the symbol includes at least one plurality of check-code bits corresponding to the at least one data block, respectively, wherein the first and second numbers are based on a number of the transmitted data bits, a symbol bit-size of the symbol, and at least one value related to at least one of a data-block bit-size of the data block and a number of the plurality of check-code bits, and wherein the first wireless communication device is to determine a number of data blocks to be included in the sequence of symbols based on the number of the transmitted data bits and the at least one value; to determine a number of symbols in the sequence of symbols based on the number of data blocks and the symbol bit-size; to determine a total number of repetition bits based on the number of the transmitted data bits, the number of symbols and the symbol bit-size; and to determine the second number based on the total number of repetition bits and the number of data blocks.

20. The wireless communication system of claim 19, wherein the first wireless communication device is to determine the check-code bits based on a check-code block including the set of data bits and a plurality of zero bits, and wherein a number of the zero bits is equal to the second number.

21. The wireless communication system of claim 19, wherein the first wireless communication device is to determine the check-code bits based on a check-code block, which includes the set of data bits and the set of repetition bits.

22. A wireless communication system including:

a first wireless communication device to transmit to a second wireless communication device a sequence of wireless communication symbols representing transmitted data bits, wherein a symbol of the symbols includes at least one data block, which includes a set of data bits and a set of repetition bits, the set of data bits including a first number of the transmitted data bits, and the set of repetition bits including a second number of bits, which are identical to at least a subset of the set of data bits, wherein the symbol includes at least one plurality of check-code bits corresponding to the at least one data block, respectively, wherein the first and second numbers are based on a number of the transmitted data bits, a symbol bit-size of the symbol, and at least one value related to at least one of a data-block bit-size of the data block and a number of the plurality of check-code bits, and wherein the first wireless communication device is to determine a number of data blocks to be included in the sequence of symbols based on the number of the transmitted data bits and the at least one value; to determine a number of symbols in the sequence of symbols based on the number of data blocks and the symbol bit-size; and to determine the second number based on the number of the transmitted data bits, the number of symbols and the symbol bit-size.

23. A non-transitory product including a storage having stored thereon instructions, wherein the instructions, when executed by a machine, cause the machine to:

generate a sequence of wireless communication symbols representing transmitted data bits, wherein a symbol of the symbols includes at least one data block, which includes a set of data bits and a set of repetition bits, the set of data bits including a first number of the transmitted data bits, and the set of repetition bits including a second number of bits, which are identical to at least a subset of the set of data bits, wherein the symbol includes at least one plurality of check-code bits corresponding to the at least one data block, respectively, wherein the instructions cause the machine to determine the check-code bits based on a check-code block including the set of data bits and a plurality of zero bits, wherein a number of the zero bits is equal to the second number, and wherein the first and second numbers are based on a number of the transmitted data bits, a symbol bit-size of the symbol, and at least one value related to at least one of a data-block bit-size of the data block and a number of the plurality of check-code bits.

24. The product of claim 23, wherein the check-code block includes the set of data bits and the set of repetition bits.

25. The product of claim 23, wherein the instructions cause the machine to determine a number of data blocks to be included in the sequence of symbols based on the number of the transmitted data bits and the at least one value; determine a number of symbols in the sequence of symbols based on the number of data blocks and the symbol bit-size; determine a total number of repetition bits based on the number of the transmitted data bits, the number of symbols and the symbol bit-size; and determine the second number based on the total number of repetition bits and the number of data blocks.

26. The product of claim 23, wherein the instructions cause the machine to determine a number of data blocks to be included in the sequence of symbols based on the number of the transmitted data bits and the at least one value; determine a number of symbols in the sequence of symbols based on the number of data blocks and the symbol bit-size; and determine the second number based on the number of the transmitted data bits, the number of symbols and the symbol bit-size.

* * * * *

UNITED STATES PATENT AND TRADEMARK OFFICE
CERTIFICATE OF CORRECTION

PATENT NO.         : 8,290,073 B2
APPLICATION NO.    : 12/575518
DATED              : October 16, 2012
INVENTOR(S)        : Assaf Kasher It is certified that error appears in the above-identified patent and that said Letters Patent is hereby corrected as shown below:

On the title page, item (56), in column 2, under "Other Publications", line 2-7, after "2011." delete "IEEE P802.11n/D2.00,......pp. 1-498." and insert the same below "2011.", as a new entry.

In the Drawings:

On sheet 1 of 14, in Figure 1, Box No. 112, line 1, delete, "Scarmbler" and insert -- Scrambler --, therefor. (As shown on attached sheet)

On sheet 1 of 14, in Figure 1, Box No. 173, line 1, delete "Descarmbler" and insert -- Descrambler --, therefor. (As shown on attached sheet)

Signed and Sealed this
Twenty-fourth Day of December, 2013

Margaret A. Focarino
*Commissioner for Patents of the United States Patent and Trademark Office*